(12) United States Patent
Kim

(10) Patent No.: US 7,517,755 B2
(45) Date of Patent: Apr. 14, 2009

(54) METHOD FOR FABRICATING SEMICONDUCTOR DEVICE

(75) Inventor: Jin Bae Kim, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 156 days.

(21) Appl. No.: 11/448,746

(22) Filed: Jun. 8, 2006

(65) Prior Publication Data

US 2007/0173042 A1  Jul. 26, 2007

(30) Foreign Application Priority Data

Jan. 26, 2006 (KR) .................. 10-2006-0008292

(51) Int. Cl.
*H01L 21/336* (2006.01)
(52) U.S. Cl. ..................... 438/257; 438/262
(58) Field of Classification Search ............... 438/257, 438/258, 262, 723, 725
See application file for complete search history.

(56) References Cited

U.S. PATENT DOCUMENTS

2003/0214046 A1* 11/2003 Lee et al. .................. 257/767
2004/0259300 A1* 12/2004 Futase et al. ............... 438/202

FOREIGN PATENT DOCUMENTS

| CN | 10-2005-0117061 A | 12/2005 |
|---|---|---|
| KR | 1992-0007098 | 4/1992 |
| KR | 10-0158939 | 12/1998 |
| KR | 2001-0001450 | 1/2001 |
| KR | 10-0488546 | 5/2005 |
| KR | 2005-0104230 | 11/2005 |

OTHER PUBLICATIONS

Zhuang Da-Ren, "VLSI fabrication technique," *VLSI* pp. 354-355 (Jul. 20, 2002).

* cited by examiner

*Primary Examiner*—David S Blum
(74) *Attorney, Agent, or Firm*—Townsend and Townsend and Crew LLP

(57) ABSTRACT

A method for fabricating a semiconductor device includes forming a gate structure comprising a stacked structure of a gate electrode and a gate hard mask layer over a semiconductor substrate having a device isolation structure. An insulating film filling up the gate structure is formed. A predetermined region of the insulating film is selectively etched to expose the semiconductor substrate of a bit line contact region. A C-HALO ion implantation process is subjected to the exposed semiconductor substrate. The insulating film is removed.

9 Claims, 4 Drawing Sheets

METHOD FOR FABRICATING SEMICONDUCTOR DEVICE

BACKGROUND OF THE INVENTION

The present invention relates to a method for fabricating a memory device. In particular, the present invention relates to a method for fabricating a semiconductor device wherein an insulating film instead of a photoresist film is filled between gate structures when impurity ions are injected into a semiconductor substrate of a bit line contact region, and then the insulating film is removed to expose the bit line contact region without the etched residue, thereby reducing leakage current of a cell transistor.

FIG. 1 is a simplified cross-sectional view illustrating a method for fabricating a semiconductor device.

Referring to FIG. 1, a gate insulating film 30 is formed over a semiconductor substrate 10 having a device isolation structure 20. A gate conductive layer (not shown) and a gate hard mask layer (not shown) are formed over the entire surface of the resultant. The gate hard mask layer and the gate conductive layer are etched using a gate mask (not shown) to form a gate structure 60 including a stacked structure of a gate electrode 45 and a gate hard mask layer pattern 55. Next, a photoresist film (not shown) filling up the gate structures 60 is formed, and then exposed and developed using a bit line contact mask (not shown) to form a photoresist film pattern 80 exposing the semiconductor substrate 10 of a bit line contact region 85. Impurity ions are injected into the semiconductor substrate 10 exposed at the bottom of the bit line contact region 85 by using the photoresist film pattern 80 as an ion implantation mask.

According to the above method for fabricating a semiconductor device, photoresist film residue remains at the bottom of the bit line contact region during the process for forming the photoresist film pattern that exposes the semiconductor substrate of the bit line contact region because the gap between gate structures becomes narrow as the design rule of semiconductor devices are reduced.

Accordingly, the leakage current of the device due to the photoresist film residue in the bit line contact region is generated in the subsequent ion implantation process. Unlike other mask processes, the photoresist film of the bit line contact region over and between the gate structures should be removed with an exposure and development process. Despite the excessive exposure process for a thickness of 8000 Å, the photoresist residue remains at sidewalls of the gate structure of the bit line contact region. As a result, there is a substantially reduced margin for the subsequent ion implantation process.

BRIEF SUMMARY OF THE INVENTION

According to the present invention, techniques for a method for fabricating a memory device are provided. In particular, the present invention provides a method for fabricating a semiconductor device wherein an insulating film instead of a photoresist film is filled between gate structures when impurity ions are injected into the semiconductor substrate of a bit line contact region, and then the insulating film is removed to expose the bit line contact region without etched residue, thereby reducing leakage current of the cell transistor.

In one embodiment of the present invention, a method for fabricating a semiconductor device includes: (a) forming a gate structure comprising a stacked structure of a gate electrode and a gate hard mask layer over a semiconductor substrate having a device isolation structure; (b) forming an insulating film filling up the gate structure; (c) selectively etching a predetermined region of the insulating film to expose the semiconductor substrate of a bit line contact region; (d) subjecting the exposed semiconductor substrate to a C-HALO ion implantation process; and (e) removing the insulating film.

DETAILED DESCRIPTION OF THE INVENTION

Reference will now be made in detail to exemplary embodiments of the present invention. Wherever possible, the same reference numbers will be used throughout the drawings to refer to the same or like parts. It should be appreciated that the embodiments are provided to describe and enable the invention to those skilled in the art. Accordingly, the embodiments described herein may be modified without departing from the scope of the present invention.

FIGS. 2a through 2e are simplified cross-sectional views illustrating a method for fabricating a semiconductor substrate in accordance with an embodiment of the present invention.

Figure 1:
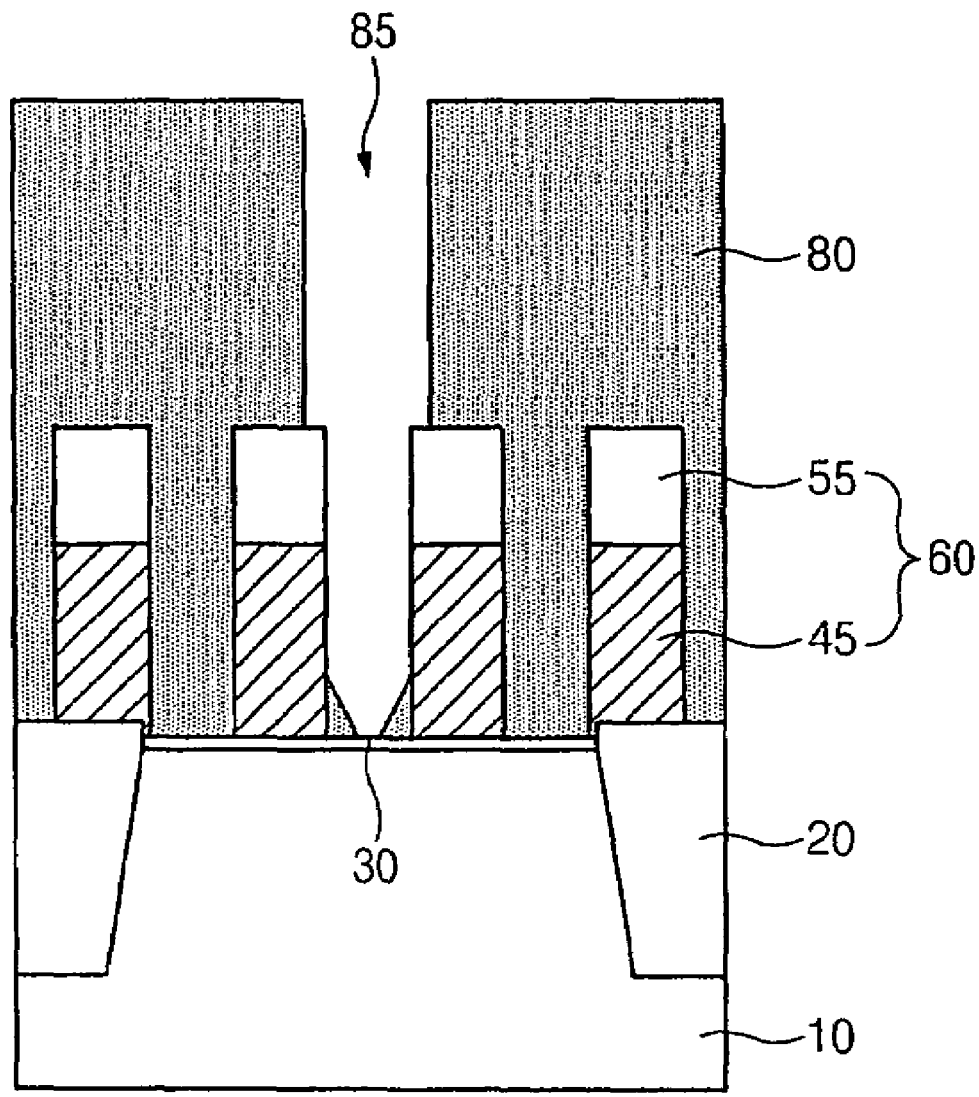
FIG. 1 is a simplified cross-sectional view illustrating a method for fabricating a semiconductor device.
Figure 2A:
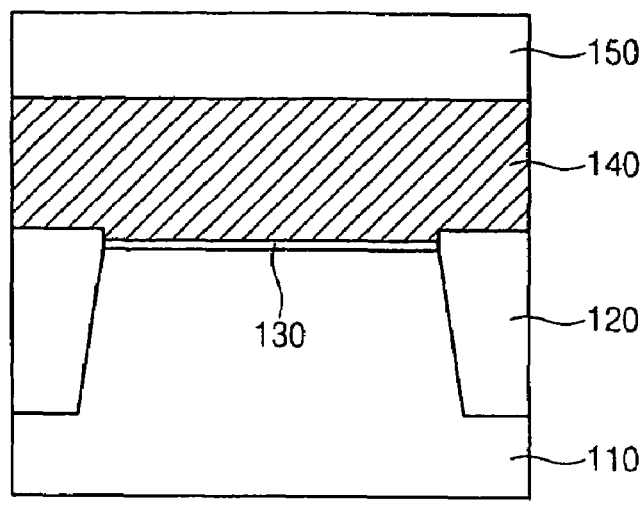
FIGS. 2a through 2e are simplified cross-sectional views illustrating a method for fabricating a semiconductor device in accordance with an embodiment of the present invention.
Figure 2B:
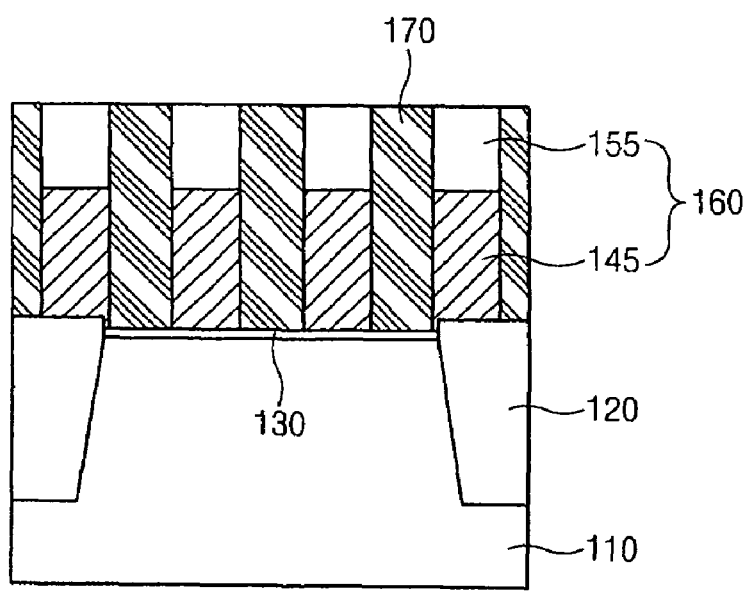

Referring to FIGS. 2a and 2b, a gate insulating film 130 is formed over a semiconductor substrate 110 having a device isolation structure 120. A gate conductive layer 140 and a gate hard mask layer 150 are formed over the gate insulating film 130. Next, the gate hard mask layer 150 and the gate conductive layer 140 are patterned using a gate mask (not shown) as an etching mask to form a gate structure 160 comprising a stacked structure, a gate electrode 145 and a gate hard mask layer pattern 155. Thereafter, an insulating film 170 filling up the gate structures 160 is formed. The insulating film 170 is planarized until the gate hard mask layer pattern 155 is exposed. In one embodiment of the present invention, the thickness of the insulating film 170 ranges from about 2000 Å to about 5000 Å. In addition, the gate hard mask layer 150 and the insulating film 170 are formed of materials having a different etching selectivity. For example, the gate hard mask layer 150 is formed of an oxide film while the insulating film 170 is formed of a nitride film. In another embodiment, the gate hard mask layer 150 is formed of a nitride film while the insulating film 170 is formed of an oxide film.

Figure 2C:
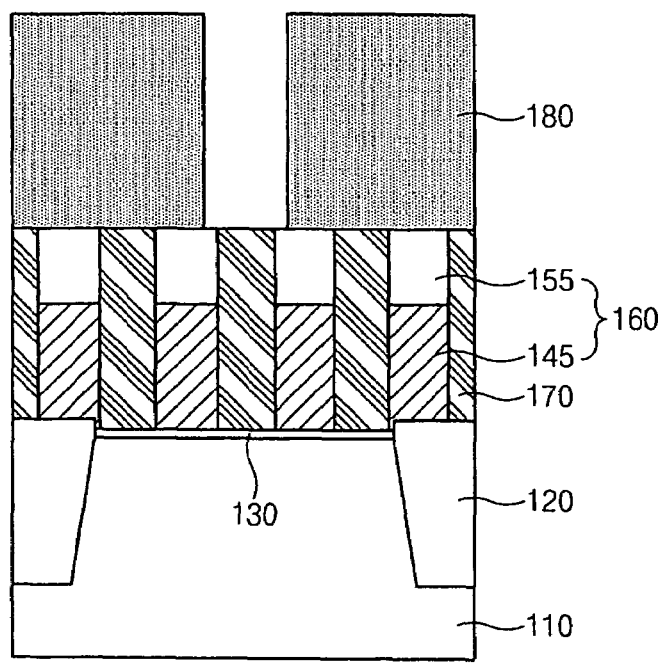
Figure 2D:
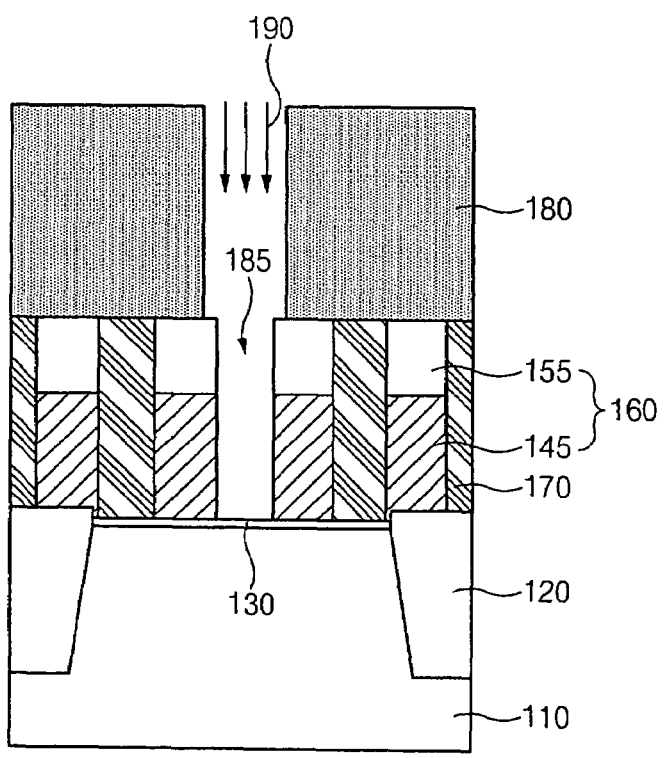

Referring to FIGS. 2c and 2d, a photoresist film (not shown) is formed over the entire surface of the resultant, and then exposed and developed using a bit line contact mask (not shown) to form a photoresist film pattern 180 defining a bit line contact region 185. The insulating film 170 exposed at the bottom of the photoresist film pattern 180 is removed to expose the gate insulating film 130 at the bottom of the bit line contact region 185. Thereafter, a C-HALO ion implantation process is performed using the photoresist film pattern 180 and the gate structures 160 as an ion implantation mask to form an ion implantation region (not shown) in the semiconductor substrate 110 under the exposed gate insulating film 130. In one embodiment, the removing process for the insulating film 170 of the bit line contact region 185 is performed with an etch selectivity between the gate hard mask layer 150 and the insulating film 170. In addition, the removing process for the insulating film 170 is performed using a wet etching method including HF or BOE (Buffered Oxide Etchant).

Figure 2E:
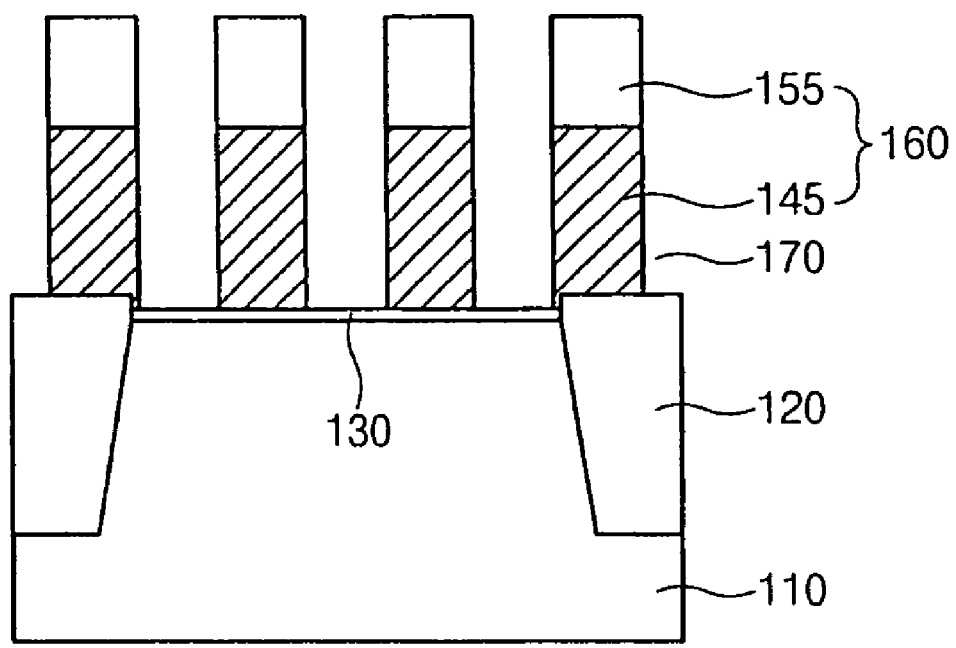

Referring to FIG. 2e, the photoresist film pattern 180 is removed. The insulating film 170 is removed using a wet etching method. In one embodiment of the present invention, the removing process for the photoresist film pattern 180 is performed using $O_2$ plasma. In another embodiment, the removing process for the insulating film 170 is performed using HF or BOE.

In addition, subsequent processes such as a process for forming LDD region, a process for forming a spacer on a sidewall of the gate structure, an ion-implantation process for forming source/drain regions in the active region, a process for forming a landing plug, a process for forming a bit line contact and a bit line, a process for forming a capacitor and a process for forming an interconnect may be performed.

As described above, the method for fabricating a semiconductor substrate in accordance with an embodiment of the present invention provides filling up the gate structure with the insulating film for a C-HALO ion implantation process instead of photoresist film and removing the insulating film of the bit line contact region by using a wet etching method, thereby easily performing the mask process for exposing the semiconductor substrate of the bit line contact region and reducing leakage current of the cell transistor.

It will be appreciated that the method described above is illustrative and other variations and modifications are possible. Order of steps may be varied, and steps may be modified or combined.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for fabricating a semiconductor device, the method comprising:
    (a) forming a gate structure comprising a stacked structure of a gate electrode and a gate hard mask layer over a semiconductor substrate having a device isolation structure;
    (b) forming an insulating film filling up the gate structure;
    (c) selectively etching a predetermined region of the insulating film to expose the semiconductor substrate in a bit line contact region, wherein step (c) comprises:
        (c-1) planarizing the insulating film until the gate hard mask layer is exposed,
        (c-2) forming a photoresist film pattern over the insulating film and the gate hard mask layer to define the bit line contact region,
        (c-3) etching the insulating film using the photoresist film pattern as an etching mask to expose the semiconductor substrate in the bit line contact region, wherein the insulating film is completely removed from the bit line contact region, and
        (c-4) removing the photoresist film pattern;
    (d) subjecting the exposed semiconductor substrate to a C-HALO ion implantation process; and
    (e) removing the insulating film.

2. The method according to claim 1, wherein the gate hard mask layer and the insulating film are formed of materials having a different etching selectivity.

3. The method according to claim 2, wherein the gate hard mask layer is formed of a nitride film, and the insulating film is formed of an oxide film.

4. The method according to claim 2, wherein the gate hard mask layer is formed of an oxide film, and the insulating film is formed of a nitride film.

5. The method according to claim 1, wherein a thickness of the insulating film ranges from about 2000 Å to about 5000 Å.

6. The method according to claim 1, wherein the removing process for the photoresist film pattern is performed using an $O_2$ plasma method.

7. The method according to claim 1, wherein the etching process for the insulating film is performed using a wet etching method with an etching selectivity between the gate hard mask layer and the insulating film.

8. The method according to claim 7, wherein the etching process is performed using HF or BOE (Buffered Oxide Etchant).

9. The method according to claim 1, wherein the removing process for the insulating film is performed by a wet etching method using HF or BOE (Buffered Oxide Etchant).

* * * * *